(12) United States Patent
Ben Ezra et al.

(10) Patent No.: US 9,749,054 B2
(45) Date of Patent: Aug. 29, 2017

(54) MULTILAYER VERTICAL CAVITY SURFACE EMITTING ELECTRO-ABSORPTION OPTICAL TRANSCEIVER

(71) Applicant: Mer-Cello Wireless Solutions Ltd., Petach-Tikva (IL)

(72) Inventors: Yossef Ben Ezra, Rehovot (IL); Yaniv Ben Haim, Kfar-Mordechai (IL)

(73) Assignee: Mer-Cello Wireless Solutions Ltd., Petach-Tikva (IL)

( * ) Notice: Subject to any disclaimer, the term of this patent is extended or adjusted under 35 U.S.C. 154(b) by 0 days.

(21) Appl. No.: 14/917,025

(22) PCT Filed: Jul. 23, 2015

(86) PCT No.: PCT/IB2015/055660
§ 371 (c)(1),
(2) Date: Mar. 7, 2016

(87) PCT Pub. No.: WO2016/016783
PCT Pub. Date: Feb. 4, 2016

(65) Prior Publication Data
US 2017/0134093 A1    May 11, 2017

Related U.S. Application Data

(60) Provisional application No. 62/029,499, filed on Jul. 27, 2014.

(51) Int. Cl.
*H04B 10/00* (2013.01)
*H04J 14/00* (2006.01)
(Continued)

(52) U.S. Cl.
CPC ........... *H04B 10/40* (2013.01); *G02B 6/4246* (2013.01); *G02F 1/015* (2013.01);
(Continued)

(58) Field of Classification Search
CPC .... H04B 10/40; H04B 10/2575; H04B 10/04; G02B 6/4246; G02B 6/35; G02B 6/28;
(Continued)

(56) References Cited

U.S. PATENT DOCUMENTS 5,479,539 A * 12/1995 Goldsmith ......... G02B 6/12004
385/1
5,757,837 A * 5/1998 Lim .................... H01S 5/0264
372/50.1

(Continued)

FOREIGN PATENT DOCUMENTS

WO    2005012971 A1    2/2005

OTHER PUBLICATIONS

International Search Report and Written Opinion issued in related PCT patent application PCT/IB2015/055600 dated Jan. 11, 2016, 8 pages.

*Primary Examiner* — Ken N Vanderpuye
*Assistant Examiner* — Abbas H Alagheband
(74) *Attorney, Agent, or Firm* — Nathan & Associates Patent Agents Ltd.; Menachem Nathan

(57) ABSTRACT

Aspects of embodiments relate to an optical transceiver device, comprising: a detection region for detecting light at a first wavelength for down-conversion; and a modulation region for modulating light at a second wavelength longer than the first wavelength, wherein the detection region is substantially transparent to light at the second wavelength and located upstream to the modulation with respect to direction of propagation of first wavelength light incident onto the detection region.

10 Claims, 7 Drawing Sheets

(51) Int. Cl.
*H04B 10/40* (2013.01)
*G02F 1/015* (2006.01)
*G02B 6/42* (2006.01)
*H04B 10/2575* (2013.01)
*H01L 31/0352* (2006.01)

(52) U.S. Cl.
CPC . *H01L 31/035209* (2013.01); *H04B 10/2575* (2013.01); *G02F 2001/0155* (2013.01)

(58) Field of Classification Search
CPC ............ G02F 1/015; G02F 2001/0155; H01L 31/035209; H04Q 11/00
USPC .... 398/116, 169–171; 385/14, 1, 24, 139, 4, 385/132, 8
See application file for complete search history.

(56) References Cited

U.S. PATENT DOCUMENTS

| | | | | |
|---|---|---|---|---|
| 5,946,438 A * | 8/1999 | Minot | ............. | H04B 10/25752 257/80 |
| 7,079,718 B2 * | 7/2006 | Welch | .................... | B82Y 20/00 385/14 |
| 7,260,137 B2 * | 8/2007 | Sato | ........................ | B82Y 20/00 372/96 |
| 7,539,367 B2 * | 5/2009 | Tamura | ................ | G02B 6/4214 385/14 |
| 7,580,595 B1 * | 8/2009 | Bimberg | ................ | B82Y 20/00 385/132 |
| 7,589,882 B2 * | 9/2009 | Xie | .......................... | G02F 1/218 359/247 |
| 7,729,618 B2 * | 6/2010 | Tatum | ..................... | G06F 13/28 398/138 |
| 7,860,398 B2 * | 12/2010 | Tatum | .................. | G02B 6/4201 398/139 |
| 8,666,253 B2 * | 3/2014 | Williams | ................ | G01S 13/58 398/115 |
| 9,036,253 B2 * | 5/2015 | Esener | ...................... | G02F 3/02 359/108 |
| 9,106,338 B2 * | 8/2015 | Hui | .................... | H04B 10/2503 |
| 9,438,970 B2 * | 9/2016 | Jones | ................ | G02B 6/12019 |

* cited by examiner

MULTILAYER VERTICAL CAVITY SURFACE EMITTING ELECTRO-ABSORPTION OPTICAL TRANSCEIVER

CROSS REFERENCE TO RELATED APPLICATIONS

This application is a 371 application from international application PCT/IB2015/055600 titled "Multilayer vertical cavity surface emitting electro-absorption optical transceiver" and is related to and claims priority from U.S. Provisional Patent Application No. 62/029,499 filed Jul. 27, 2014 titled "A method and device for full duplex optical transmission of analog and digital signals based on Multilayer Vertical Cavity Surface Emitting Electro-Absorption Transceiver (ML-VCSE-EAT)", which is incorporated herein by reference in its entirety.

FIELD

Embodiments methods disclosed herein relate in general to integrated optoelectronic devices and systems and methods employing such devices.

BACKGROUND

The application of radio-over-fiber (RoF) systems and methods in, for example, broadband wireless access networks has attracted much attention because it facilitates, inter alia, the transmission of data using a variety of protocols over a single fiber. Accordingly, RoF allows for the delivery of data to remote access units (RAUs) serving a variety of protocols. Such remote access units may include, for instance, cellular base stations and Wi-Fi Access Points for providing end-users access to multi-media content delivered via the Internet.

With the employment of the RoF technique, many of the required radio frequency (RF) signal processing functions can be performed at a centralized location prior to being distributed to the RAUs via the optical fibers. This provides important cost savings, allowing the RAUs to be simplified significantly, as they may only need to perform relatively basic optoelectronic conversion, filtering, and/or amplification functions.

Considering the ever-increasing capacity in data transmission by RF and optical carrier signals, efficient interfacing between the RF signals and optical signals at the centralized location is crucial.

Accordingly, the penetration of optical fibers for successfully implementing ROF-based or other broadband networks may largely depend on the performance and the costs of optical transceivers acting as the optical-radio interface. Cost-effective optical transceivers are thus expected to accelerate the introduction of wireless broadband services for making them more readily available in public venues.

The description above is presented as a general overview of related art in this field and should not be construed as an admission that any of the information it contains constitutes prior art against the present patent application.

SUMMARY

Examples of embodiments relate, inter alia, to a device, system and method for full-duplex transmission of data encoded by signals using analog and/or digital representation techniques.

Example 1 includes an optical transceiver device (also referred to hereinafter as "OTD"), comprising a detection region for detecting light at a first wavelength for down-conversion and a modulation region for modulating light at a second wavelength longer than the first wavelength, wherein the detection region is substantially transparent to light at the second wavelength and located upstream to the modulation region with respect to direction of propagation of first wavelength light incident onto the detection region.

Example 2 includes the subject matter of example 1 and, optionally, wherein the detector region comprises a plurality of quantum wells.

Example 3 includes the subject matter of example 2 and, optionally, wherein the plurality of quantum wells ranges from 3 to 10 quantum wells Example 4 includes the subject matter of any of examples 1-3 and, optionally, further comprises a reflecting layer for reflecting the second wavelength light for up-conversion.

Example 5 includes the subject matter of example 4 and, optionally, wherein the reflecting layer comprises a Distributed Bragg Reflective (DBR) mirror having a plurality of periodic variations of a characteristic parameter.

Example 6 includes the subject matter of example 5 and, optionally, wherein the number of periodic variations (e.g., grating periods) ranges from 20 to 50.

Example 7 includes the subject matter of example 4 and, optionally, wherein the reflecting layer is partially transparent and overlays a waveguide layer so that a portion of incident second wavelength light is reflected and another portion of the incident second wavelength light is coupled into the waveguide layer.

Example 8 includes the subject matter of example 7 and, optionally, wherein the reflecting layer comprises a semiconductor saturable absorber mirror.

Example 9 includes the subject matter of examples 1-8 and, optionally, further comprises a plurality of readout contacts for reading out a voltage fluctuation and/or an electric current generated due to first wavelength light incident onto the detection region.

Example 10 includes an array comprising a plurality of optical transceiver devices according to any of the examples 1-9.

Example 11 includes the subject matter of example 10 and, optionally, wherein each optical transceiver device is optically coupled an optical fiber for allowing full-duplex data transmission over each fiber.

Example 12 includes a communication system, comprising an optical transceiver device according any of the examples 1-11; and a wavelength division demultiplexer for separating first wavelength light from second wavelength light, wherein the optical transceiver device and the demultiplexer are formed integrally with each other.

Example 13 includes the subject matter of example 12 and, optionally, further comprises a splitter for splitting the second wavelength light into a plurality of second wavelength light portions, wherein the splitter is formed integrally with the transceiver device and the demultiplexer.

Example 14 includes the subject matter of example 13 and, optionally, further comprises an optical circulator, which is formed integrally with the optical transceiver device to allow full-duplex transmission of data carried by the modulated first wavelength light and the modulated and reflected second wavelength light.

Example 15 includes a method for enabling full-duplex data transmission comprising: launching modulated light at a first short wavelength from an optical fiber into a detection region of an optical transceiver device according to any of the examples 1-9 for reading out data carried by the modulated short wavelength light; launching unmodulated light at a second wavelength longer than the first wavelength from the optical fiber into the modulation region of the optical transceiver device; modulating at least a part of the second, longer wavelength light to obtain modulated, second long wavelength light; and reflecting the long wavelength modulated light into the optical fiber.

This summary is provided to introduce a selection of concepts in a simplified form, concepts that are further described below in the detailed description. This summary is not intended to identify key features or essential features of the claimed subject matter, nor is it intended to be used to limit the scope of the claimed subject matter.

BRIEF DESCRIPTION OF THE DRAWINGS

Embodiments disclosed herein are described, by way of example only, with reference to the following accompanying drawings, wherein.

DETAILED DESCRIPTION

Figure 1:
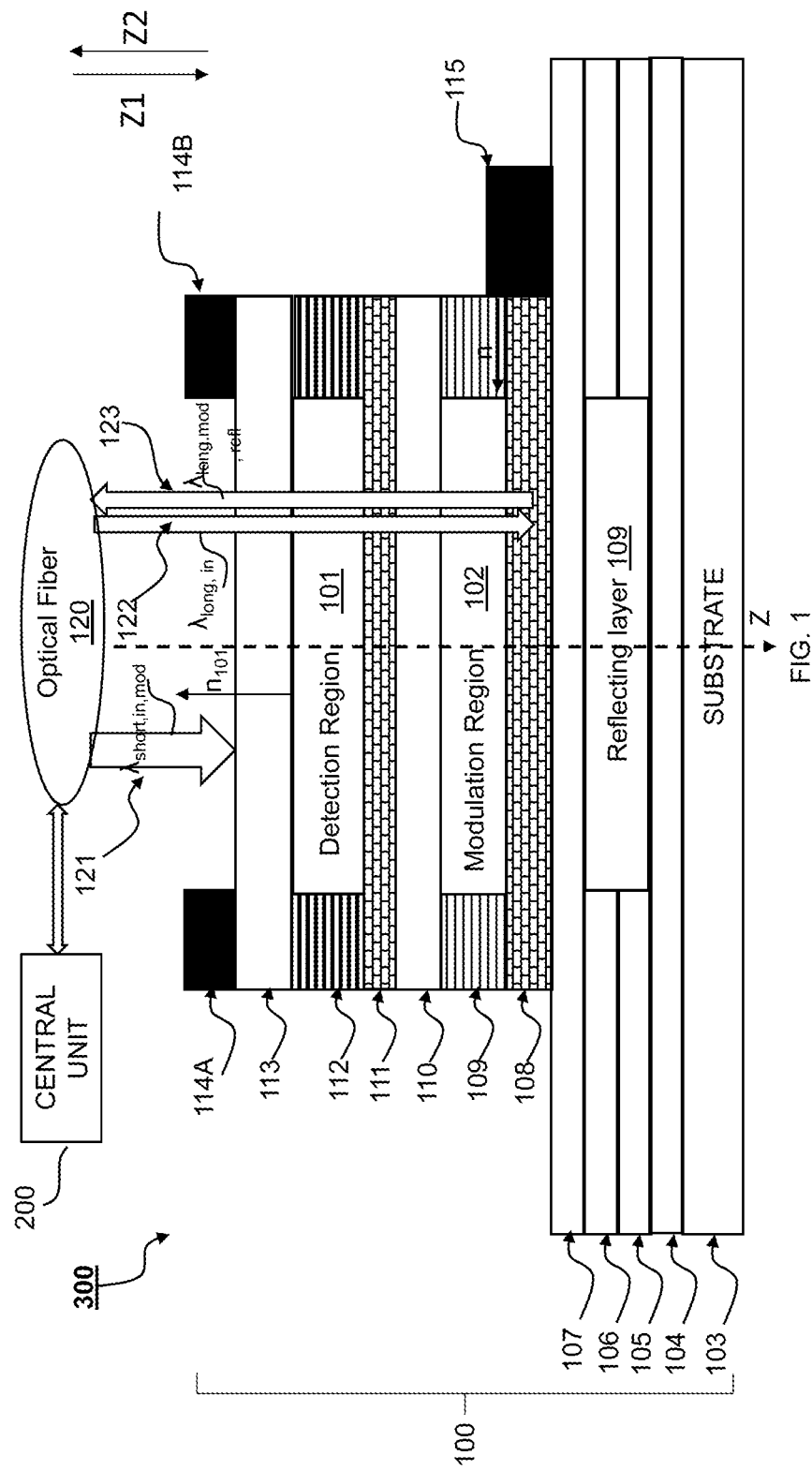
FIG. 1 is a schematic illustration of an optical transceiver device of a communication system, according to an embodiment.

Aspects of embodiments relate to a device, system and method for performing RF-to-optical conversion, also known as "up-conversion", and optical-to-RF conversion, also known as "down-conversion", and/or the full-duplex transmission of data encoded by signals using analog and/or digital representation techniques. According to an embodiment, an optical transceiver device (OTD) may provide an interface (for example an optical/RF interface) between a broadband fiber unit transmitting data to remote access units and a RF antenna unit located in a centralized location.

As already indicated, the transceiver functionality of the OTD may be full-duplex. Exemplarily, the OTD may act simultaneously as a detector of modulated optical signals and as a transmitter of modulated optical signals.

According to an exemplary embodiment, the optical transceiver device may comprise hybrid or monolithically integrated optical transceiver structures allowing full-duplex access to an optical network. The OTD may comprise a modulator based on electro-absorption (EA). In short, the optical transceiver device may comprise or embody an electro-absorption modulator (EAM). Accordingly, at some instances, the optical transceiver may be referred to as an EAM device. The OTD comprising or embodying the EAM may be suitable for simultaneous up-conversion and down-conversion of data carried by the optical signal according to analog and/or digital signal representation techniques. The EAM may be employed for up-conversion, i.e., for converting RF or wireless signals into the optical domain by e.g. external modulation of optical signals by a laser source. The EAM may also generate, optionally inherently, a photocurrent. This effect may be exploited to obtain converter properties for down-conversion of optical signals into RF signals. Therefore, an optical transceiver device disclosed herein can simultaneously be used as a modulator in up-conversion operation and as a photodetector in down-conversion operation.

Generally, a first, "short" wavelength for down-conversion may be used for detection (also referred to as "downlink detection"), and a second, "long" wavelength may be employed for modulation in up-conversion (also referred to as "uplink modulation"). The first wavelength is shorter than the second wavelength.

It should be noted that the terms "short" and "long" used herein in conjunction with wavelengths are to distinguish between light at different wavelengths and are, as such, relative terms. Consequently, short wavelength light has a wavelength that is shorter than long wavelength light. Correspondingly, long wavelength light has a wavelength that is longer than short wavelength light.

It is noted that the term "wavelength" as used herein may also encompass "range of wavelengths". Accordingly, a first range of shorter wavelengths of light may be employed for downlink detection and a second range of longer (than the first) wavelengths of light may be employed for uplink modulation.

It should further be noted that the term "light" may encompass wavelengths that are in the visible range as well as wavelengths that are not visible to the human eye including, for example, light or electromagnetic radiation in the infrared (IR) range. To achieve downlink detection, light based on a first wavelength and incident onto the EAM may generate a voltage oscillation and/or a change in electrical current, which may then be further processed, e.g., to generate wireless signals.

Uplink modulation may be obtained by transmitting an unmodulated or continuous wave (CW) light from a central unit to a remotely located EAM, e.g., to an EAM in a remote access unit. It is noted that the terms "unmodulated" and "continuous wave" can be used interchangeably.

At the EAM, changes are imposed or invoked to the forbidden gap of the EAM. The wavelength of the unmodulated (CW) light is selected so that changes in the forbidden gap of the EAM causes corresponding changes in the amplitude of the incident light, resulting in modulated light. Modulated light is transmitted back from the EAM to the central unit. The transmission path of modulated light from the EAM may be referred to as "uplink".

According to an exemplary embodiment, the OTD comprising or embodying the EAM may have a multilayer structure that has different active regions for achieving sufficient high responsivity in downlink detection and sufficient modulation efficiency for uplink data transmission. More specifically, a first layer of the multilayer structure may be employed for downlink detection purposes and is designed to be responsive at a first, shorter, wavelength; and a second layer of the multilayer structure may be employed for uplink modulation purposes to be imposed on light with a second, comparably longer wavelength. The first layer may be above the second layer with respect to the propagation direction of short wavelength light, and may further be largely, substantially or completely transparent to light of the second, longer wavelength. Light at the second wavelength may be modulated and reflected back to the central unit. The modulation of the second wavelength may be invoked externally. Reflection of modulated light of the second wavelength back to the central unit may be effected exemplarily by a Bragg mirror.

Incoming first wavelength light may comprise analog and/or digital modulated components. Further, modulation of incoming second continuous or unmodulated long wavelength light may include the application of analog and/or digital data representation or modulation techniques.

The EAM functionalities of the OTD may for example be obtained by employing a Multilayer Vertical Cavity Surface Emitting Electro-Absorption Structure (M-SEAS), as outlined herein below in more detail.

While in some exemplary embodiments the OTD may be standalone, while in some other exemplary embodiments it may be integrally formed with additional components. The OTD may exemplarily be formed integrally with integrated circuits that are based on, e.g., CMOS manufacturing technology. In some embodiments, the OTD may exemplarily be formed integrally with a Radio Frequency Integrated Circuit (RFIC). In some embodiments, the OTD may be formed integrally and/or integrated in conjunction with, e.g., electrical components and/or with optical components that are, optionally, passive components. In some embodiments, the OTD may be formed integrally with an optical and/or electrical amplifier on the same substrate, to exemplarily amplify the local RF signal received by local antennas, e.g., at the received frequencies and power levels.

Reference is now made to FIG. 1. According an embodiment, an OTD 100 may, in combination with a central unit 200, form a communication system 300 such as, e.g., a Radio-over-Fiber (RoF) communication system. Although some of the discussion herein refers to the employment of OTD 100 in RoF communication systems, this should be no means to be construed as limiting. Accordingly, OTD 100 may for example be employable as a component of digital communication systems.

OTD 100 may be considered to have a central axis Z and may comprise a detection region 101 and a modulation region 102. Propagation of light in a positive Z direction (Z1) may herein be referred to as propagation in the downstream direction. Correspondingly, propagation of light in a negative Z direction (Z2) may herein be referred to as propagation in the upstream direction Z. Modulation region 102 is positioned downstream in the propagation direction Z of incident first, short wavelength light 121 and second unmodulated long wavelength light 122, relative to detection region 101. Correspondingly, detection region 101 is located upstream of modulation region 102.

Modulation region 102 is located between a substrate 103 and detection region 101. Detection region 101 is responsive to light 121 launched into OTD 100 from an optical fiber 120 at a first, short, wavelength ($\lambda_{short}$) concerning its detection; and modulation region 102 is designed such as to be able to impose modulation onto light 122, carried exemplarily by optical fiber 120, at a second, long, wavelength $\lambda_{long}$, which is longer than $\lambda_{short}$. While detection region 101 is substantially transparent and, correspondingly, non-responsive to the second wavelength, the same detection region 101 allows detection of incident light 121 at the first, short, wavelength $\lambda_{short,in}$. Light 121 responsively engaging with detection region 101 at the first wavelength $\lambda_{short,in}$ may herein be referred to as modulated first wavelength light 121 at $\lambda_{short,in,mod}$ and light 122 at the second wavelength $\lambda_{long,in}$ which engages with modulation region 102 for being modulated (e.g., externally) may herein be referred to as second wavelength light 122 at $\lambda_{long,in}$. Modulated light 123 at the second wavelength ($\lambda_{long}$) emanating from OTD 100 in the upstream direction may herein be referred to as modulated second wavelength light 123 ($\lambda_{long,refl,mod}$).

In some embodiments, detection region 101 and modulation region 102 may be designed so that a minimum difference or wavelength separation between modulated first wavelength light 121 ($\lambda_{short,in,mod}$) and second wavelength light 122 at $\lambda_{long,in}$ may exemplarily range from 150 nm to 250 nm.

Generally speaking, OTD 100 may comprise any suitable material or combination of materials. OTD 100 may for example be based on GaAs or InP, in which case the short wavelength may be about 1300 nm and the longer wavelength may be about 1550 nm. Alternatively, the device may be also based on Si/SiO$_2$, in which case the wavelengths may range from about 890 nm to about 1100 nm.

The doping concentration of a layer or layers (e.g., detection region 101 and/or modulation region 102) of OTD 100 may, for example, range from about $10^{16}$ to about $10^{18}$ cm$^{-3}$.

With respect to the normal of the surface of detection region 101, second wavelength light 123 ($\lambda_{long,\ refl,mod}$) emanating from OTD 100 may be "vertically" emitting. Otherwise stated, the direction of propagation of second wavelength light 123 ($\lambda_{long,\ refl,mod}$) may be parallel to the normal $n_{101}$ of the upper surface of the layer embodying the detection region 101.

According to an embodiment, detection region 101 may be embodied as a multiple quantum well (MQW) layer comprising, for example, from 3 to 10 quantum wells (QWs). The number of quantum wells may be selected based on the modulation and/or detection efficiency and/or the bandwidth of OTD 100. The detection region may for example be based on InGaAsP or on any other suitable material or combination of materials.

According to an embodiment, modulation region or layer 102 may be optimized to achieve efficient modulation of the second wavelength λ2 to obtain modulated, reflected second wavelength light 123 ($\lambda_{long,refl,mod}$). Modulation region 102 may for example be based on Al$_x$Ga$_{1-x}$As,In$_x$Ga$_{1-x}$As, InP, Si/SiO$_2$; or any other suitable material or combination of materials. In an embodiment, modulation may be imposed on long second wavelength light 123 after being reflected from modulation region 102 by a reflecting layer 109 included in OTD 100.

Layer 109 for reflecting long wavelength light 123 may be implemented exemplarily by a Bragg or distributed Bragg reflector (DBR). The number of periodic variations of a characteristic in the DBR (e.g., the number of repeating grating periods) may for example range from 20 to 50. Modulated, reflected second wavelength light 123 ($\lambda_{long,refl,mod}$) may emanate from OTD 100 for coupling the modulated and reflected long wavelength light into optical fiber 120. In an embodiment, layers 104-107 surrounding reflecting layer 109 may be based on same materials as the reflecting layer yet doped, e.g., with Si or Carbon. Analogously, layers 108-110 surrounding the modulation region 102 and layers 111-113 surrounding the detection region 101 may respectively comprise materials of the modulation and detection region, yet may again be doped, e.g., with Si or Carbon. In an embodiment, layers 104-107 may be wider, i.e., have a larger lateral extension than layers 108-113. Accordingly, a part of the upper surface of layer 107 may not be covered by layer 108.

According to an embodiment, OTD 100 may include a plurality of conductive (e.g., metallic) contacts that may serve as input and/or output ports for analogue and/or digital signals. Input signals may be for example be employed for electrically driving modulation region 102. For instance, conductive (e.g., metallic) a first or second contact 114A and 114B may be employed with a third contact 115 for reading out voltage or current oscillations that may be generated in detection region 101. Further, first or second contacts 114A and 114B may be employed with third contact 115 for modulating long wavelength light 123.

First and second contacts 114A and 114B may for example overlay layer 113, which itself overlays detection region 101. First and second contacts 114A and 114B may be positioned at some lateral distance from one another on layer 113, for example, in juxtaposition with each other at distal edges of layer 113. Third contact 115 may for example overlay a portion of layer 107 which is not covered by layer 108. Further, third contact 115 may be laterally juxtaposed relative to modulation region 102 such as to be operably coupled therewith. For example, a vertical surface of third contact 115 having a surface direction indicated by normal (n) (FIG. 1) pointing perpendicular relative to direction Z, may at least engage or make contact with a vertical surface of layer 109 facing the said vertical surface of third contact 115.

Figure 2:
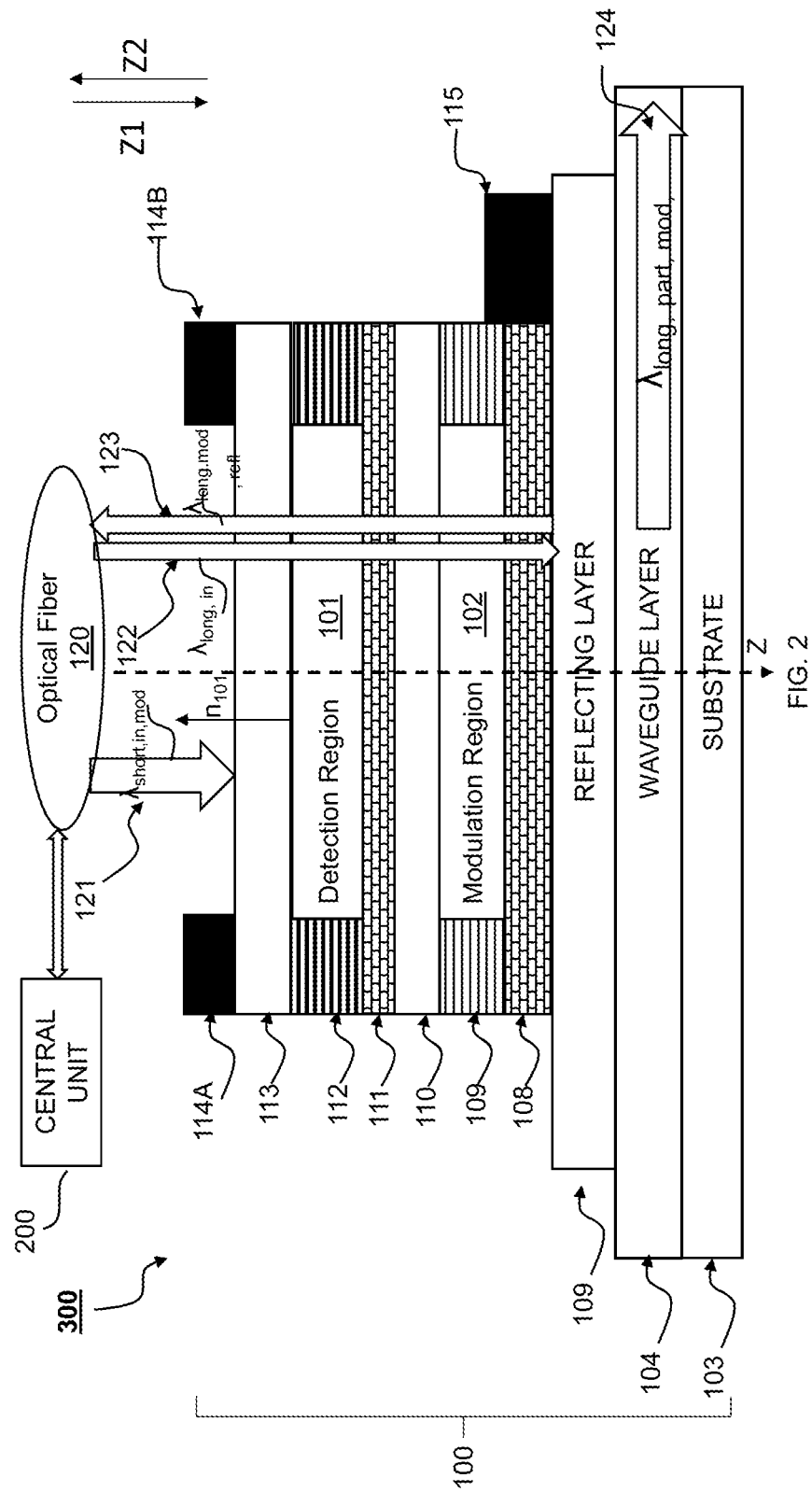
FIG. 2 is a schematic illustration of an optical transceiver device of a communication system, according to another embodiment.

Third contact 115 may be employed in cooperation with first contact 114A or second contact 114B to enable modulation of, e.g., long wavelength light 123 reflected from reflecting layer 109. More specifically, in an embodiment, third contact 115 may be coupled with modulation region 102 such to enable with, e.g., first contact 114A or second 114B, modulation of reflected second long wavelength light ($\lambda_{long,refl}$) to obtain modulated second wavelength light 123 ($\lambda_{long,refl,mod}$), e.g., by applying a modulating voltage between third contact 115 and first contact 114A or second contact 114B that changes the characteristics of modulation region 102 to impose modulation. Further reference is made to FIG. 2. According to another embodiment, OTD 100 may be configured to allow adapting the transparency of reflecting layer 109 to the second, long wavelength light 122. For example, reflecting layer 109 may be embodied by a semiconductor saturable absorber mirror (SESAM), which overlays a waveguide layer 104. SESAM layer 109 may be located between modulation region 102 and waveguide layer 104. Further, waveguide layer 104 may be sandwiched between substrate 103 and SESAM layer 109.

The transparency of SESAM layer 109 may be adaptable from central unit 200, e.g., through variation of laser power of the source for second, long wavelength light. In a scenario where the SESAM layer 109 is not fully reflective (i.e., it is partially transmissive), some portion of the incident wavelength light 122 ($\lambda_{long,in}$) may be coupled into waveguide layer 104 for routing a rest or residual portion of the second, modulated longer wavelength light 124 ($\lambda_{long,part,mod}$) to a destination different than fiber 120 for example.

Figure 3:
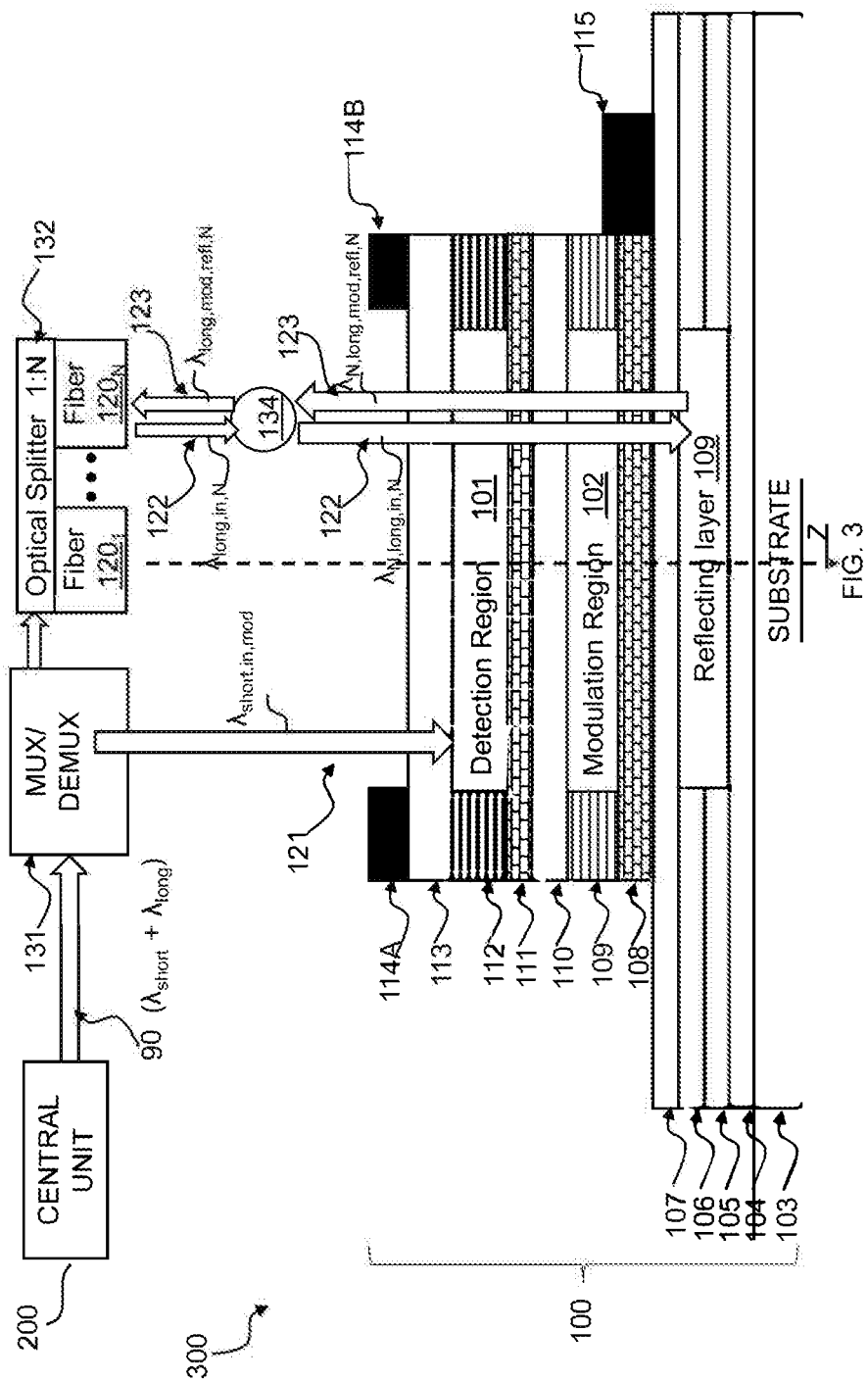
FIG. 3 is a schematic illustration of an optical transceiver device integrated with optical components of a communication system, according to an embodiment.
Figure 4:
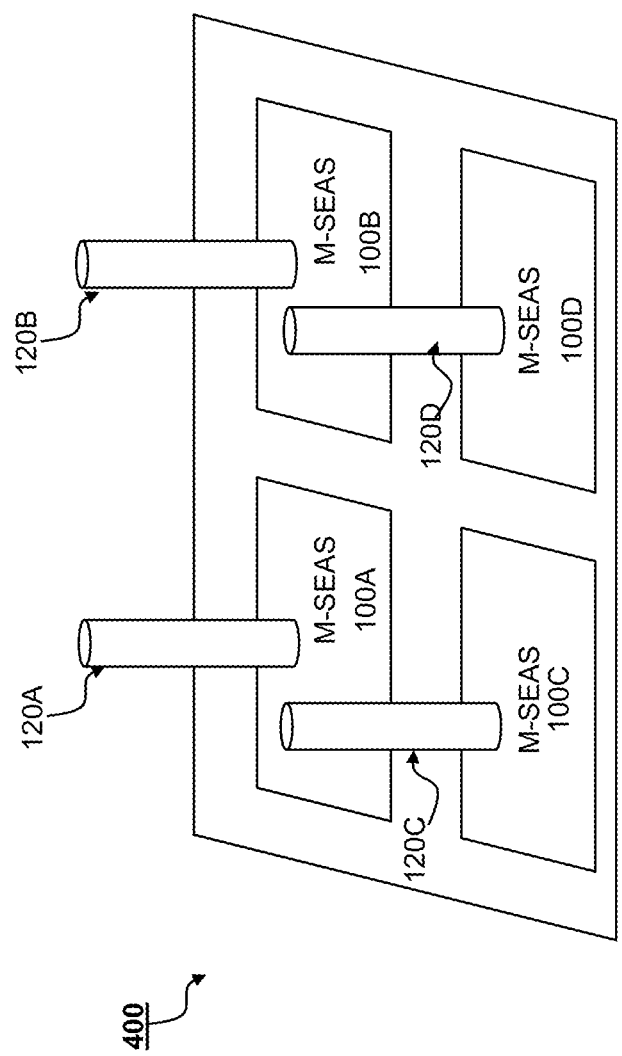
FIG. 4 is a schematic illustration of an array of optical transceiver devices that are operatively coupled with a respective plurality of optical fibers of a communication system, according to an embodiment.

Additional reference is made to FIGS. 3 and 4. According to some embodiments, an OTD 100 as schematically illustrated, for example, in FIG. 1 or FIG. 2, may be integrally formed with additional optical (and optionally passive) components on the same substrate to form an integrated ROF communication system 300, schematically shown in FIG. 3 using, e.g., Si photonics fabrication technologies. In an embodiment, integrated optical system 300 may comprise an OTD 100, a wavelength demultiplexer (Demux) 131, an optical splitter 132 for splitting and coupling light into a plurality of waveguides 133, and an optical circulator 134, e.g., for each one of the plurality of waveguides.

In an embodiment, incoming modulated light 90 may have or encompass a plurality of short and long wavelengths. Incoming modulated light 90 may be launched into and split by Demux 131 into short and long wavelengths $\lambda_{short,mod,in} \ldots \lambda_{long,in}$. Hence, modulated first wavelength light 121 ($\lambda_{short,in,mod}$) and unmodulated second wavelength light 122 $\lambda_{long,in}$ at comparably longer wavelengths is obtained.

Modulated light 121 at shorter wavelengths $\lambda_{short,mod,in}$ of downlink may be directed towards OTD 100 such to be incident onto region 101, which may detection result in the voltage or current oscillations in detection region 101 that can be readout via first or second contacts 114A or 114B, and third contact 115.

Further, light 122 at the comparably longer wavelengths $\lambda_{long,in}$ may be split by optical splitter 132 into a plurality of light waves $\lambda_{long,in,1} \ldots \lambda_{long,N}$ of the same wavelength which are then coupled into a respective plurality of waveguides or fibers $120_1, \ldots 120_N$. Light 122 at each one of the longer wavelengths $\lambda_{long,in, 1-N}$ for being directed towards modulation region 102 of the same transceiver 100 via common optical circulator 134 to obtain modulated light waves to be launched back for the uplink. Reflected, modulated second, long wavelength light waves 123 $\lambda_{long,refl,mod,1-N}$ may be coupled back with the respective waveguides $120_{1-N}$ via corresponding optical circulator 134 from the modulation regions 102 of the corresponding OTDs. Optical circulator 134 may be employed to allow in each OTD 100, bidirectional propagation of first longer wavelengths 122 $\lambda_{long,refl,mod,1-N}$ and second longer wavelengths 123 $\lambda_{long,refl,mod,1-N}$ over the same optical waveguide (not shown). Otherwise stated, optical circulator 134, which may be integrally formed with other components of OTD 100, may be employed for separating incoming (downlink) short wavelength light 121, from the reflected long, modulated, wavelength light 123.

With respect to the uplink, the above-described structure of integrated ROF communication system 300 enables concatenation of a plurality of OTDs 100 such that they may all share the same laser for generating respective modulated second wavelength light 123 $\lambda_{long,refl,mod,1-N}$ for corresponding uplinks. The plurality of modulated light waves carrying data and which are reflected from the different OTDs 100 can be collected by respective waveguides $120_1$-$120_N$ and launched to the same photodetector at central unit 200. FIG. 4 shows schematically an array 400 of OTDs 100A-100D that are communicably coupled with respective waveguides $120_1$-$120_4$. For example, each OTD 100 can be optically aligned with a separate optical fiber 120A-120D. Alternatively, array 400 of OTDs 100A-100D may be communicably coupled with the same fiber 120 using WDM, where each OTDs 100A-100D may be designed to be responsive to a different wavelength or range of wavelengths.

Figure 5:
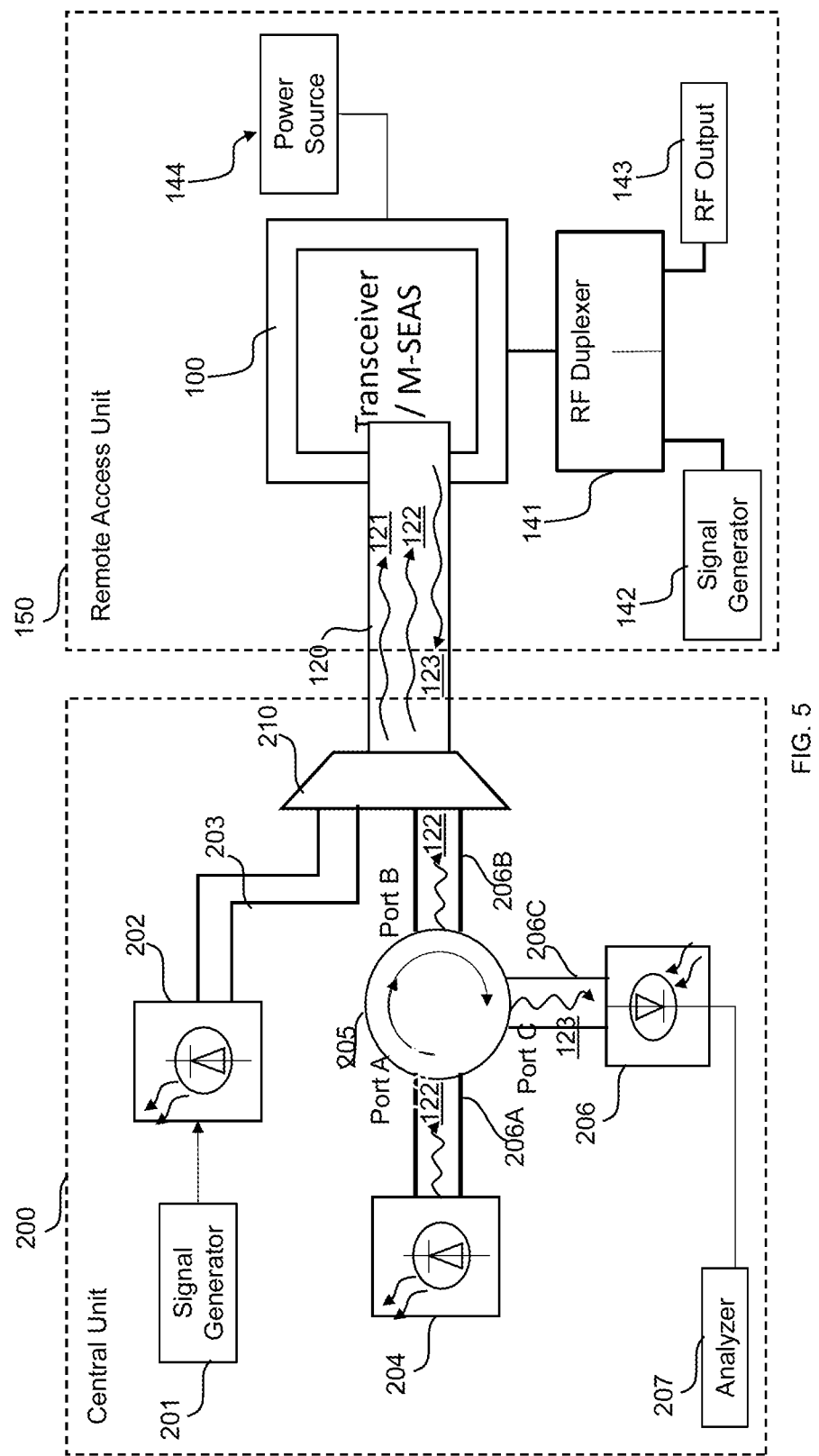
FIG. 5 is a schematic detailed block diagram illustration of a full-duplex communication system, according to an embodiment.

Referring now to FIG. 5, a communication system 500 allowing full-duplex optical transmission may comprise central unit 200 that is communicatively coupled with a remote access unit 150. According to an embodiment, central unit 200 may include a signal generator 201 and a "short" wavelength laser source 202 (e.g., 1310 nm). Signal generator 201 may modulate the light emitted by short wavelength laser source 202 to obtain first wavelength modulated light 121 at $\lambda_{short,in,mod}$, which is coupled into a downlink fiber 203. Central unit 200 may further include an optical duplexer 210 which is operative to couple first wavelength modulated light 121 ($\lambda_{short,in,mod}$) into shared fiber 120. Shared or "duplex-carrying" fiber 120 carries first wavelength modulated light 121 ($\lambda_{short,in,mod}$) from optical duplexer 210 to OTD 100 of remote access unit 150. Remote access unit 150 may comprise a power source 144 for the operation of the OTD and, optionally, further electronic devices (not shown) such as, for example, amplifiers. At least some of first wavelength modulated light 121 ($\lambda_{short,in,mod}$) may be incident onto the "upper" detection region or layer 101 (FIGS. 1-3) and, at least partially, absorbed thereby. Responsive to the absorption of light 121 by the detection region 101, changes in the voltage difference or current between may be readout via third conductive contact 115 in cooperation with first or second contacts 114A or 114B. These changes in the voltage difference or current over time may be indicative of a signal envelope carried by first wavelength modulated light 121 ($\lambda_{short,in,mod}$). Data descriptive of these voltage changes may be transmitted using RF from or over a suitable RF output 133 of remote access unit 150 such as, for example, for example, an RF antenna, or a coaxial cable. RF output 133 may in some embodiments be operatively coupled to an RF duplexer 141 that provides RF from OTD 100 to RF output 143.

According to an embodiment, with respect to RF-to-optical up-conversion for the transmission of data descriptive of information, ROF communication system 500 may comprise a "long" wavelength source 204 which is operatively coupled with a first uplink fiber portion 206A, feeding the first uplink fiber portion 206A with "long", unmodulated, second wavelength light 122, passing through a first and second port A and B of circulator 205 into a second uplink fiber portion 206B. Second uplink fiber portion 206B is coupled to optical duplexer 210, in parallel with downlink fiber 203. Optical duplexer 210 may couple long, second, unmodulated wavelength light 122 into shared fiber 120. Hence, short and long second wavelength light 121 and 122 may be concurrently transmitted over shared fiber 120.

In some embodiments, unmodulated wavelength light 122 may be launched into a 1:N splitter (cf. FIG. 3, not shown in FIG. 5), in case a plurality of concatenated remote access units (not shown) comprising a respective plurality of OTDs 100 is employed.

Unmodulated wavelength light 122 may traverse without significant losses detection region 101 (FIGS. 1-3) and impact modulation region 102, where the long wavelength light 122 may be modulated by employing a signal generator 142 imposing corresponding changes in the properties of modulation region 102. The light may be reflected back into shared fiber 120 as second, long wavelength, modulated light 123, which is directed by circulator 205 from second uplink fiber portion 206B into a third uplink fiber portion 206C. Modulated light 123 is incident onto detector 206, generating a corresponding uplink RF output. The uplink RF output may be analyzed using an analyzer 207.

Modulation may be imposed onto at least some portion of long wavelength light 122, e.g., through an electric analogue of digital modulation signal which invokes changes in the physical properties (e.g., light absorption properties) of modulation region 102. These changes in the physical properties may, in turn, cause corresponding amplitude modulation of light in modulation region 102. In other words, the intensity of at least some portion of the short wavelength light may be altered over time in dependence of the applied electrical signal to obtain second, long wavelength, modulated light 123. The second, long wavelength, modulated light 123 may be coupled back into shared fiber 120 using a reflecting layer 109 (FIGS. 1-3) which may be for example be implemented as a distributed Bragg reflector. Second, long wavelength, modulated light 123 may propagate back via shared fiber 120 to central unit 200. As already indicated with respect to FIG. 2 with reference to the employment of OTD 100 that comprises a SESAM structure, a part of the incoming second, long wavelength signal 122 may be modulated and reflected as by the SESAM structure back into shared fiber 120 as second, long wavelength, modulated light signal 123, while a rest portion may be coupled as second, modulated, long wavelength light 124 into waveguide layer 104 of the SESAM structure.

According to an embodiment, the electronic modulating signal comprises a biasing DC voltage component, e.g., in order to improve the modulation efficiency and responsivity of modulation region 102.

Figure 6:
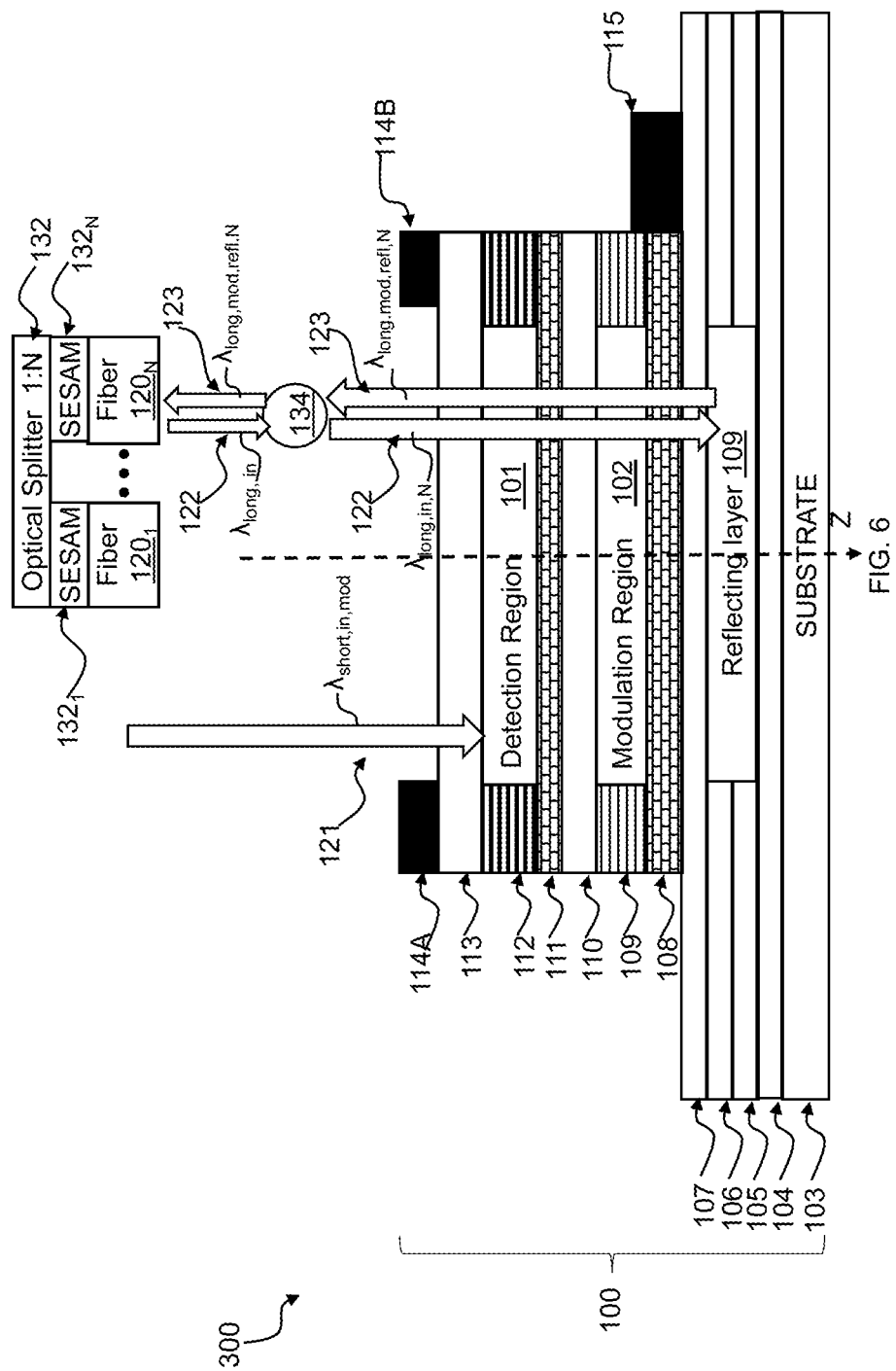
FIG. 6 is a schematic illustration of an optical transceiver device of a communication system, according to a yet alternative embodiment.

Referring now to FIG. 6, SESAM structures $133_1$-$133_N$ may be employed between respective outputs of splitter 132 and inputs of fibers $120_1$-$120_N$. SESAM structures $133_1$-$133_N$ may be employed for controlling the transparency and, hence, the power distribution between different OTDs 100 according to ROF communication system requirements. The power distribution may be for example be tuned or controlled according to the architecture and/or topology of full-duplex ROF communication system 500. The power distribution may for instance be adapted in accordance with the distance between central unit 200 and remote access unit 150 and/or the number of concatenated OTDs 100.

Figure 7:
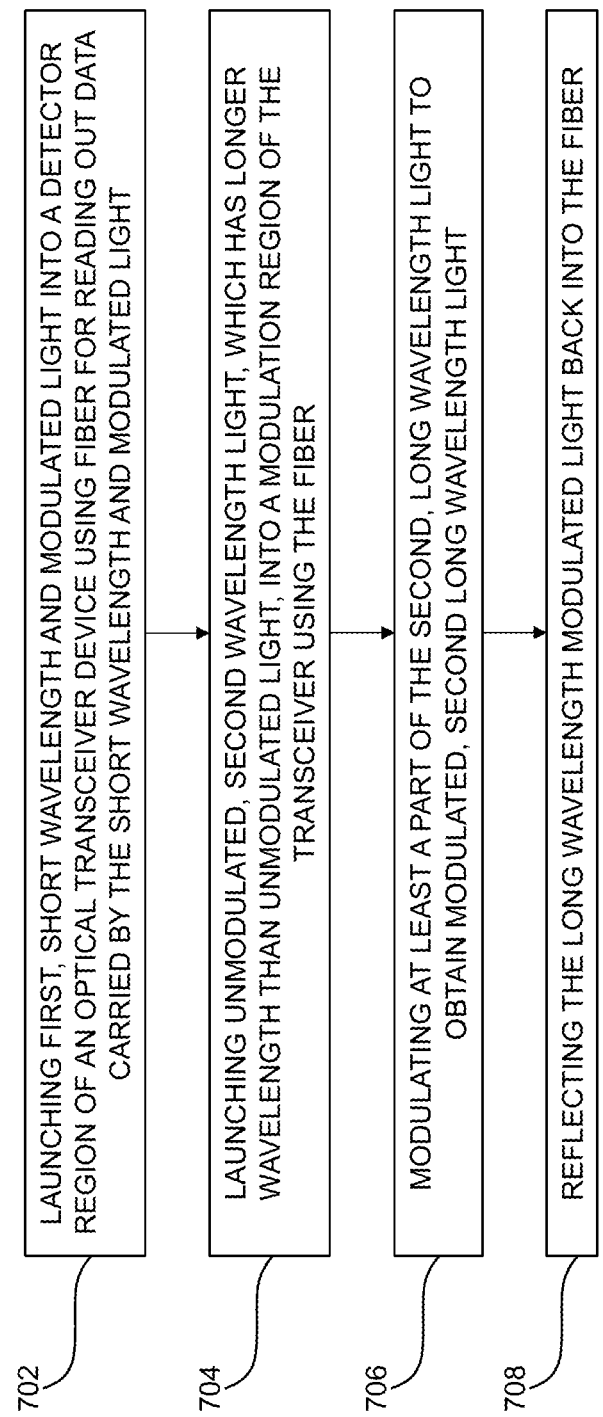
FIG. 7 is flowchart illustration of method for performing full-duplex data transmission, according to an embodiment.

Further reference is made to FIG. 7. An embodiment of a method for enabling full-duplex data transmission may include as indicated by block 702, for example, launching first, short wavelength and modulated light 121 into detection region 101 of OTD, e.g., using fiber 120, for reading out data carried by the short wavelength and modulated light 121.

As indicated by block 704, the method may further include, for example, launching unmodulated, second long wavelength light 122, which has a longer wavelength than first, short wavelength and modulated light 121, into modulation region 102 of OTD 100, e.g., using fiber 120. Modulation region 102 is located downstream of detection region 101 with respect to the direction of propagation of both the short and long wavelength light 121 and 122. Detection region 101 is substantially transparent to second wavelength light 122. In other words, attenuation of second wavelength light passing or propagating through detection region 101 may be negligible.

As indicated by box 706, the method may further include, for example, modulating at least a part of the second, long wavelength light 122 to obtain second, long wavelength modulated light 123.

As indicated by box 708, the method may include, reflecting at least a portion of the second, long wavelength modulated light 123, back into the fiber 120.

In the claims or specification of the present application, unless otherwise stated, adjectives such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended.

It should be understood that where the claims or specification refer to "a" or "an" element, such reference is not to be construed as there being only one of that element.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

While this disclosure describes a limited number of embodiments, it will be appreciated that many variations, modifications and other applications of such embodiments may be made. The disclosure is to be understood as not limited by the specific embodiments described herein, but only by the scope of the appended claims.

What is claimed is:

1. An optical transceiver device (OTD), comprising:
   a) a detection region for detecting light at a first wavelength for down-conversion, the light at the first wavelength being incident onto the detection region;
   b) a modulation region for modulating light at a second wavelength longer than the first wavelength to obtain modulated second wavelength light, wherein the detection region is substantially transparent to the light at the second wavelength and located upstream to the modulation region with respect to a direction of propagation of the light at the first wavelength light incident onto the detection region; and
   c) a reflecting layer for reflecting the modulated second wavelength light for up-conversion, wherein the reflecting layer is partially transparent and overlays a waveguide layer so that a portion of the modulated second wavelength light is reflected and another portion of the modulated second wavelength light is coupled into the waveguide layer.

2. The OTD of claim 1, wherein the detector region comprises a plurality of quantum wells.

3. The OTD of claim 2, wherein the plurality of quantum wells ranges from 3 to 10 quantum wells.

4. The OTD of claim 1, wherein the reflecting layer comprises a Distributed Bragg Reflective mirror having a plurality of periodic variations of a characteristic parameter.

5. The OTD of claim 4, wherein the plurality of periodic variations ranges from 20 to 50.

6. The OTD of claim 1, wherein the reflecting layer comprises a semiconductor saturable absorber mirror.

7. The OTD of claim 1, further comprising a plurality of readout contacts for reading out a voltage fluctuation and/or an electric current generated due to the first wavelength light incident onto the detection region.

8. An array comprising a plurality of optical transceiver devices (OTDs) according to claim 1.

9. The array of claim 8, wherein each OTD is optically coupled an optical fiber for allowing full-duplex data transmission over each optical fiber.

10. A method for enabling full-duplex data transmission comprising:
    a) launching modulated light at a first short wavelength from an optical fiber into a detection region of an optical transceiver device (OTD) that includes a detection region for detecting light at a first wavelength for down-conversion;
    b) launching unmodulated light at a second wavelength which is longer than the first wavelength from the optical fiber into a modulation region of the OTD, wherein the detection region is substantially transparent to light at the second wavelength and located upstream to the modulation region with respect to a direction of propagation of the light at the first wavelength;
    c) modulating the light at the second, longer wavelength to obtain modulated second long wavelength light; and
    d) reflecting the modulated second long wavelength light into the optical fiber using a reflecting layer of the OTD, wherein the reflecting layer is partially transparent and overlays a waveguide layer of the OTD so that a portion of the modulated second wavelength light is reflected for up-conversion and another portion of the modulated second wavelength light is coupled into the waveguide layer.

* * * * *